United States Patent [19]

Ning et al.

[11] 4,157,269
[45] Jun. 5, 1979

[54] UTILIZING POLYSILICON DIFFUSION SOURCES AND SPECIAL MASKING TECHNIQUES

[75] Inventors: Tak Hung Ning; Hwa Nien Yu, both of Yorktown Heights, N.Y.

[73] Assignee: International Business Machines Corporation, Armonk, N.Y.

[21] Appl. No.: 912,919

[22] Filed: Jun. 6, 1978

[51] Int. Cl.² .................. H01L 21/225; H01L 21/285
[52] U.S. Cl. .................... 148/1.5; 29/577 R; 29/579; 29/591; 148/174; 148/175; 148/187; 148/188; 156/643; 156/644; 156/653; 156/657; 156/659; 357/20; 357/34; 357/54; 357/59; 357/91; 427/85; 427/86; 427/88
[58] Field of Search ............... 148/1.5, 174, 175, 187, 148/188; 156/643, 644, 652, 653, 656, 657, 659; 357/20, 34, 54, 59, 91; 29/576 B, 577, 578, 579, 591; 427/85, 86, 88

[56] References Cited

U.S. PATENT DOCUMENTS

| | | | |
|---|---|---|---|
| 3,460,007 | 8/1969 | Scott | 148/174 X |
| 3,719,535 | 3/1973 | Zoroglu | 148/187 |
| 3,837,935 | 9/1974 | Maeda et al. | 148/187 |
| 3,904,450 | 9/1975 | Evans et al. | 148/175 |
| 3,915,767 | 10/1975 | Welliver | 148/188 X |
| 4,006,046 | 2/1977 | Pravin | 148/187 |
| 4,013,489 | 3/1977 | Oldham | 148/174 |
| 4,060,427 | 11/1977 | Barile et al. | 156/653 X |
| 4,074,304 | 2/1978 | Shiba | 357/59 |

*Primary Examiner*—L. Dewayne Rutledge
*Assistant Examiner*—W. G. Saba
*Attorney, Agent, or Firm*—John J. Goodwin

[57] ABSTRACT

A method consisting of a sequence of process steps for fabricating a bipolar transistor having base contacts formed of polysilicon material and an emitter contact formed of polysilicon material or metal. The emitter contact is self-aligned to the base contacts by the use of process steps wherein a single mask aperture is used for defining the base contacts and the emitter.

10 Claims, 14 Drawing Figures

UTILIZING POLYSILICON DIFFUSION SOURCES AND SPECIAL MASKING TECHNIQUES

DESCRIPTION

Technical Field

The present invention relates to processes for the fabrication of bipolar transistors and more particularly to processes for fabricating bipolar transistors having base contacts formed of polysilicon and emitter contacts formed of polysilicon or metal which are self-aligned to the base contacts, thereby resulting in devices having a very small separation between emitter and base contacts so that base resistance is reduced and the device is relatively small.

BACKGROUND ART

Bipolar transistors of either the NPN or PNP type require contacts usually through suitable contact holes to the base, collector and emitter regions. Ordinarily these contacts are formed of a conductive metal such as aluminum or a combination of chromium and gold. Examples of bipolar transistors having metal base, collector and emitter contacts are shown in U.S. Pat. No. 3,855,007 issued Dec. 17, 1974 to Polata et al, U.S. Pat. No. 3,885,494 issued May 27, 1975 to Millar, U.S. Pat. No. 3,943,555 issued Mar. 9, 1976 to Mueller et al and U.S. Pat. No. 3,971,059 issued July 20, 1976 to Dunkley et al.

It is also known that polysilicon material may be used to form the gate of a bipolar device. In U.S. Pat. No. 4,050,965 issued Sept. 27, 1977 to Ipri et al, a method for fabricating a bipolar transistors is described which includes a gate formed of polysilicon material and wherein the edge of the polysilicon gates serves as the diffusion edge for both the base and emitter difusions. In this patent however, metal interconnects are used for the base, emitter and collector and is therefore different from the method and structure of the present invention.

DISCLOSURE OF THE INVENTION

One of the limitations of the performance of a bipolar device is its base resistance. The base resistance can be reduced by forming the bipolar device with a very small extrinsic base area, and to have a very small spacing between the emitter and the base. Methods are described herein by which a bipolar transistor is fabricated having the emitter self-aligned to the polysilicon base contacts, resulting in a very small separation between emitter and base contacts. Base resistance is thus reduced and the active device is made smaller. The polysilicon base contacts do not require mask-defined contact-hole openings in the active device region. This results in a much smaller extrinsic base area, and hence a much reduced collector capacitance and provides a high performance device.

The fabrication method of the present invention can provide a bipolar transistor having polysilicon base contacts and a polysilicon emitter contact, the steps of which are illustrated in FIGS. 1A through 1H and 1I through 1K, or a bipolar transistor having polysilicon base contacts and a metal emitter contact, the steps of which are illustrated in FIGS. 1A through 1H and 2A through 2C.

Figure 1A:
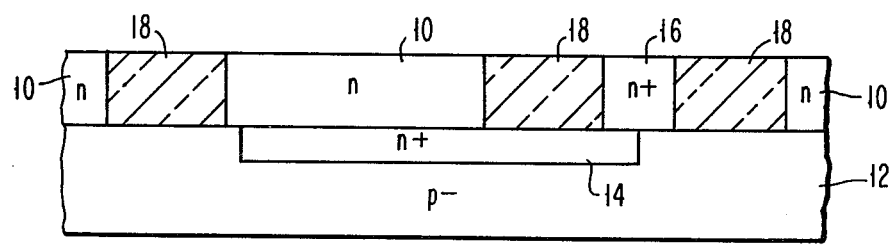
FIGS. 1A through 1H and FIGS. 1I, 1J and 1K are cross-sectional views illustrating the steps of one embodiment of a method for fabricating a bipolar transistor wherein the base contact and the emitter contact are formed of polysilicon material.
Figure 1B:
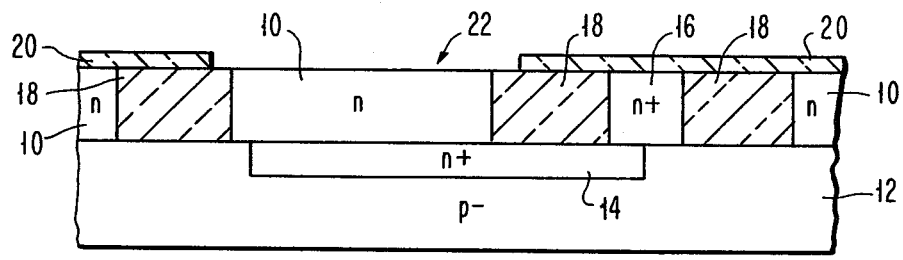
Figure 1C:
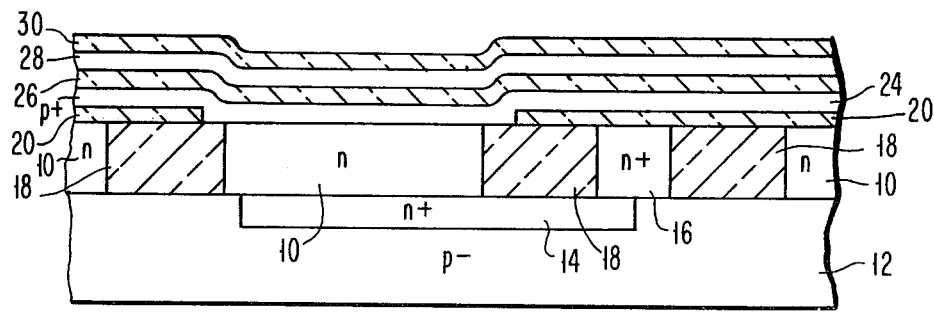
Figure 1D:
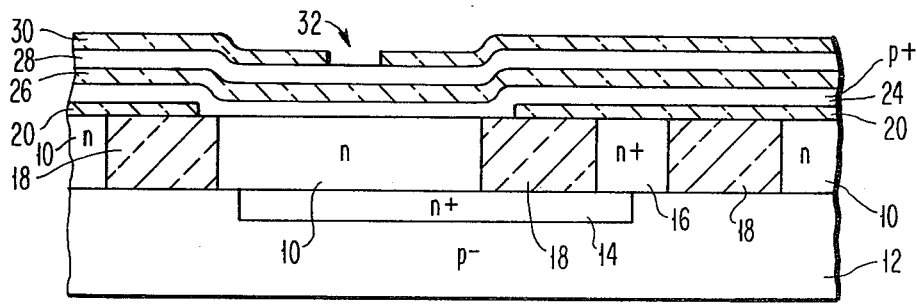

In FIG. 1A, an epitaxial layer 10, composed for example of n-type semiconductor material, is deposited on a substrate 12, composed for example of standard p-type substrate material such as silicon. A subcollector region 14 is formed, for example, by diffusing an n-type impurity within the substrate 12 using conventional diffusion techniques. A subcollector reach-through 16 and oxide isolations 18 are formed.

In step 1B, a thin layer 20 of insulating material such as silicon dioxide ($SiO_2$) is disposed on layer 10 and and opening 22 in layer 20 in the emitter and base region is created by conventional photo-lithographic techniques.

In step 1C a layer of boron-doped p+ polysilicon 24 is deposited by conventional chemical vapor deposition techniques. In practice, if penetration of the boron through the silicon dioxide insulting layer 20 becomes a problem, an extra layer composed of silicon nitride may be applied above the silicon dioxide layer 20 in step 1B. Next, a layer of silicon dioxide 26, a layer of aluminum oxide ($Al_2O_3$) 28 and a layer of silicon dioxide 30 are respectively deposited by conventional chemical vapor deposition techniques. The aluminum oxide layer 28 will be used a an oxidation mask and reactive-ion etching mask for etching silicon dioxide. Alternatively, other materials that serve the same purpose, such as silicon nitride, may be used in place of aluminum oxide provided that the top layer of silicon dioxide 30 is thick enough to mask silicon nitride during a later reactive-ion etching step.

In step 1D, photo-lithographic techniques are used to open the silicon dioxide layer 30 to form an emitter window 32. Then, the aluminum dioxide layer 28 under window 32 is etched as is the silicon dioxide layer 26. Then, using, for example, $HF:HNO_3:CH_3COOH = 1:3:8$ with $H_2O_2$ added as oxidizing agent, the heavily doped p+ polysilicon layer 24 under window 32 is preferentially etched and purposely undercut to provide the structure illustrated in FIG. 1E. Alternatively, the p+ polysilicon layer 24 can be first etched partially through by reactive-ion etching and then finish the etching by using the preferential etchant $HF:HNO_3:CH_3COOH = 1:3:8$ with $H_2O_2$ added as oxidizing agent. This combination of reactive-ion etching and wet chemical etching provides better control of the amount of undercut.

Figure 1E:
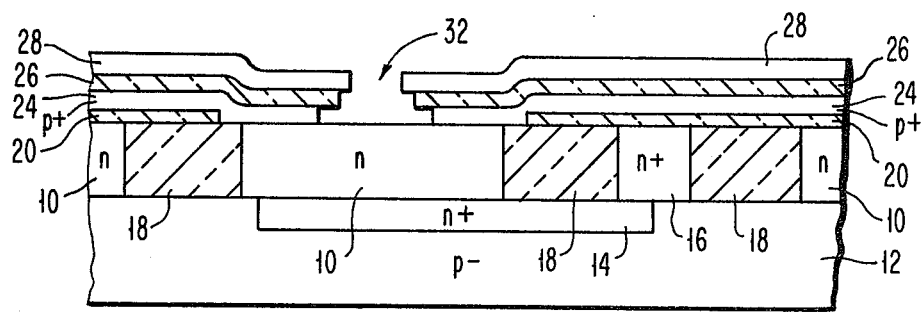
Figure 1F:
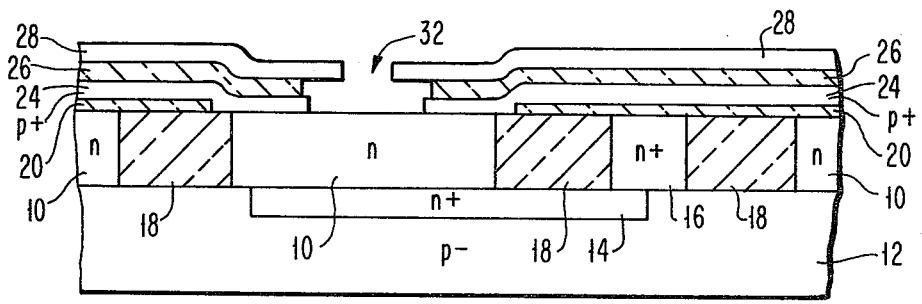

The next step is the etching of the silicon dioxide layer 26 to remove the portion which overhangs the polysilicon layer 24 to provide the structure illustrated in FIG. 1F.

Figure 1G:
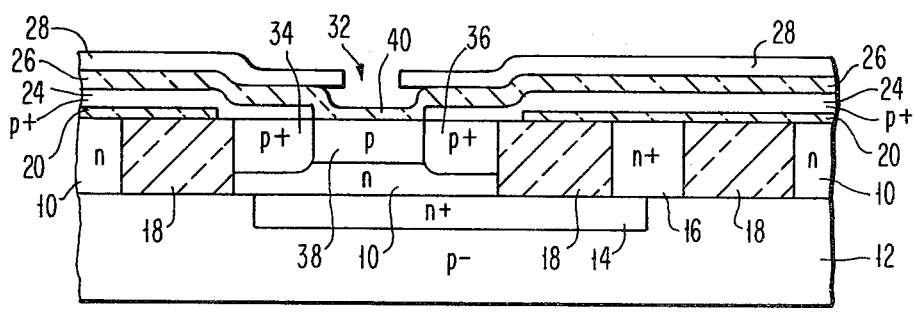

In the step illustrated in FIG. 1G, the intrinsic base 38 is formed by boron diffusion. During the boron drive in process the extrinsic base regions 34 and 36 are doped from the p+ polysilicon layer 24. Then silicon dioxide 40 is grown on the sides of the polysilicon layer 24 and over the intrinsic base region 38.

Figure 1H:
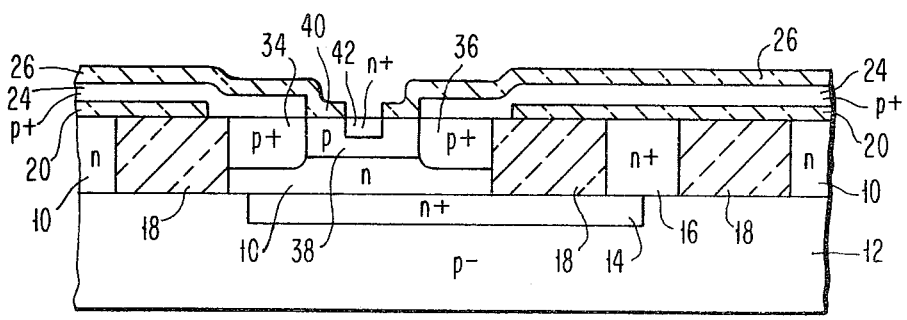

With the aluminum oxide layer 28 used as an etch mask, reactive-ion etching is employed to etch the silicon dioxide portion 40 to define the emitter size. Then arsenic is implanted to form the emitter 42 as illustrated in FIG. 1H. The aluminum oxide layer 28 is then removed or alternatively, the aluminum oxide layer 28 can be removed prior to the step of implanting the emitter.

At this point in the fabrication process, the base regions 34 and 36 are in contact with polysilicon layer 24 and the emitter 42 is opened. Further steps in the process will depend on whether a polysilicon or a metal emitter contact is desired.

Figure 1I:
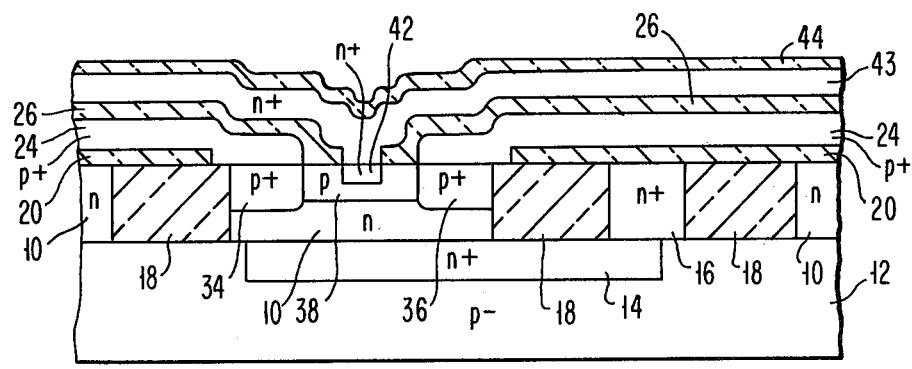
Figure 1J:
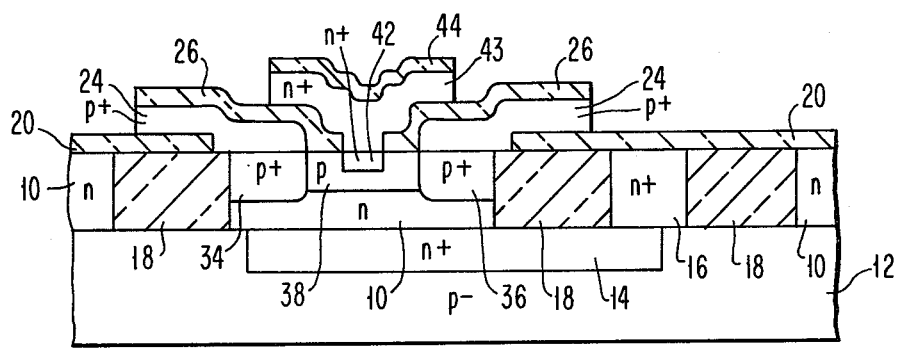
Figure 1K:
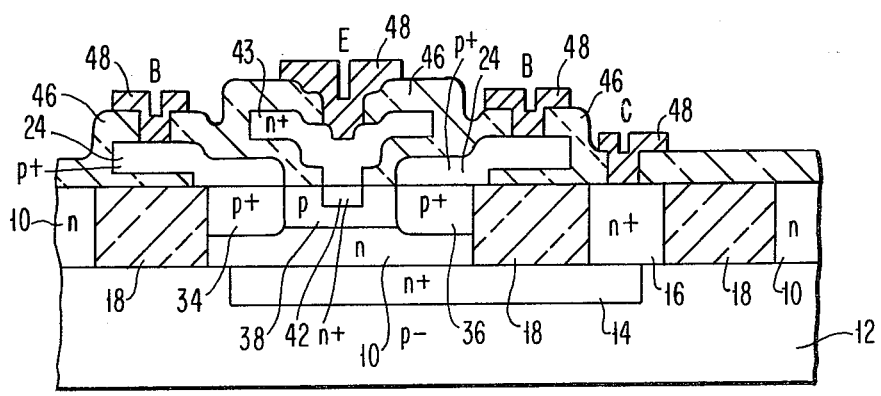

In the formation of a polysilicon emitter contact, the steps illustrated in FIGS. 1I, 1J and 1K are performed. Referring to FIG. 1I, a layer of arsenic-doped polysilicon 43 is deposited by chemical vapor deposition and then a layer of silicon dioxide 44 is deposited, also by chemical vapor deposition. Next, using two separate conventional masking and etching steps, the base polysilicon contacts 24 and the emitter polysilicon contact 43 are formed and the emitter is driven in, as shown in FIG. 1J.

Finally, a further layer of silicon dioxide 46 is formed by chemical vapor deposition and a contact hole is opened to the emitter polysilicon 43 and contact holes are opened to the base polysilicon 24 and to the subcollector reach-through 16. Metal 48 is deposited over and through the contact holes to the emitter and base polysilicon 43, 24 and collector reach-through 16 and the metal 48 is delineated to provide the device shown in FIG. 1K.

It is seen therefore, that the emitter 42 has a polysilicon contact 43 and base regions 34 and 36 have polysilicon contacts 24 and that the emitter contact 43 is self-aligned to the base contacts 24 because the same window or opening in the aluminum oxide layer 28 was used to define the base contacts 24 in the step associated with FIG. 1E and to define the emitter window in the step associated with FIG. 1H.

Figure 2A:
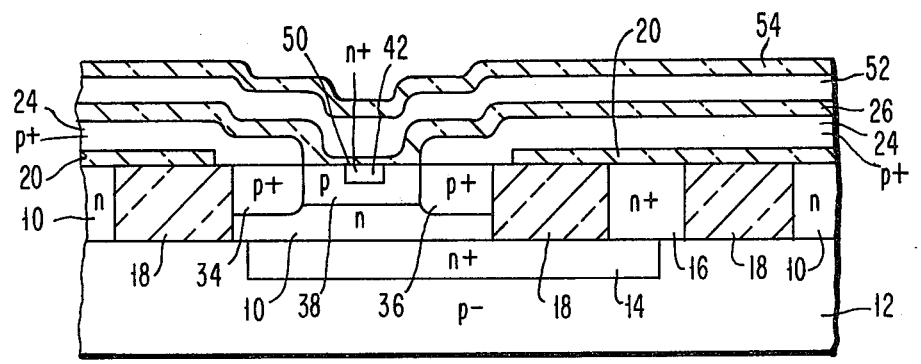
FIGS. 2A, 2B and 2C, are cross-sectional views showing steps which, if taken after the steps illustrated in FIGS. 1A through 1H, illustrate a method for fabricating a bipolar transistor wherein the base contact is formed of polysilicon material and the emitter contact is metal.

If it is desired to provide a metal emitter contact, the process is carried out in the same way up through the steps that result in the structure of FIG. 1H. Then a thin pad or layer of silicon dioxide 50 is formed on the emitter 40, as shown in FIG. 2A, and layer of silicon nitride 52 and a layer of silicon dioxide 54 are formed by chemical vapor deposition. The silicon nitride layer 52 will be used as an oxidation mask during the later oxide growth step.

Figure 2B:
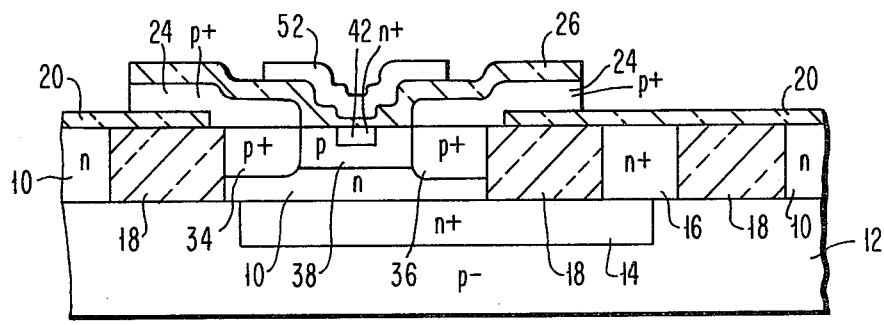

Using two separate masking and etching steps, the silicon nitride layer 52 and the base polysilicon layer 24 are delineated as illustrated in FIG. 2B.

Figure 2C:
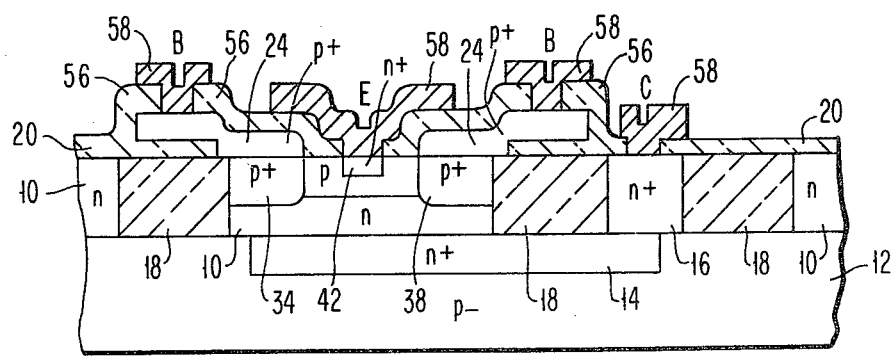

In the step illustrated in FIG. 2C, the emitter is driven in and silicon dioxide 56 is grown on the sides of polysilicon layer 24 at the same time. Contact holes are opened to the base polysilicon 24 and to subcollector reach through 16. The silicon nitride 52 (of FIG. 2B) is removed and the silicon dioxide 50 over the emitter 42 is dip etched to open the emitter 42 for metal contact. Finally a metal a layer 58 is deposited and delineated to form a metal emitter contact and to contact the polysilicon base contacts 24 and the collector reach through 16 and provide the complete device.

In the described embodiments, the recessed-oxide-isolation technique was employed, however the present invention is applicable to other isolation techniques such as diffusion isolation or a combination of diffusion and recessed oxide isolation. Likewise, alternative materials known in the art may be used instead of the specific substances designated in the description of the process.

INDUSTRIAL APPLICABILITY

The process of the present invention may be used to fabricate bipolar transistors which are widely used in the electronics industry. Because the process provides a bipolar transistor with a small separation between the emitter and base contacts, the transistor can be made smaller and is therefore significant in the production of circuits requiring a high density of components to be packaged in a small area or volume. This advantage is in addition to the reduced base resistance which results in high performance operation. Since the polysilicon base contacts fabricated according to the process of the present invention do not require mask-defined contact-hole openings in the active device region, a small extrinsic base area is required and therefore the transistor exhibits a reduced collector capacitance which enhances performance. Also, the base polysilicon can be contacted in convenient places remote from the active device area, thereby increasing the possible wiring configurations which may be employed. This is an important feature in high density circuit arrangements. The same is true for the case wherein a polysilicon emitter contact is fabricated. The emitter polysilicon can also be contacted in convenient places remote from the emitter $n^+$ region, thereby increasing the wireability of the circuits.

While we have illustrated and described the preferred embodiments of our invention, it is to be understood that we do not limit ourselves to the precise constructions herein disclosed and the right is reserved to all changes and modifications coming within the scope of the invention as defined in the appended claims.

Having thus described our invention, what we claim as new, and desire to secure by Letters Patent is:

1. A method of fabricating a bipolar structure having base contacts formed of polysilicon material comprising:
- A. forming, on a semiconductor substrate of a first conductivity type having a collector region of opposite conductivity type disposed therein, a layer of opposite conductivity type epitaxil material having at least two oxide regions therein spaced apart a given distance over said collector region,
- B. forming a first masking layer over said epitaxial layer having an opening therein in the area between said oxide isolation regions,
- C. forming a layer of polysilicon material having first conductivity type impurities therein over said masking layer, said polysilicon material being in contact with said layer of epitaxial material in said open area of said masking layer,
- D. forming a layered masking structure over said layer of polysilicon material, said layered masking structure having an opening therein to provide an emitter window in the region above said opening in said first masking layer,
- E. etching through said opening in said layered making structure to provide an opening to said layer of epitaxial material,
- F. diffusing impurities of said first conductivity type into said layer of epitaxial material in between said at least two oxide isolation regions to form extrinsic base regions beneath and in contact with said polysilicon material, and to form an intrinsic base region intermediate said extrinsic base regions and beneath said opening formed in step E, G. and implanting impurities of said opposite conductivity type through said opening formed in step E to form an emitter, thereby providing a bipolar structure having extrinsic base regions containing first conductivity type impurities in contact with polysilicon material containing first conductivity type impurities and an emitter containing opposite conductivity type impurities.

2. A method of fabricating a bipolar structure according to claim 1 further including the steps of:

H. removing said layered masking structure formed in step D and forming a layer of polysilicon material containing impurities of said opposite conductivity type over said emitter, I. forming a final layer of insulating material over said polysilicon material containing impurities of said first conductivity type and said polysilicon material containing impurities of said second conductivity type, J. opening contact holes in said final layer of insulating material over said polysilicon material containing said first conductivity type impurities and said polysilicon material containing said second polysilicon conductivity type impurities, K. and applying and delineating a layer of metal over said final layer of insulating material to form metal contacts through said contact holes to said polysilicon containing said first conductivity type impurities and said polysilicon containing said second conductivity type impurities.

3. A method of fabricating a bipolar structure according to claim 1 further including the steps of:

H. removing said layered masking structure formed in step D and forming a final layer of insulating material over said polysilicon material containing impurities of said first conductivity type and over said intrinsic base and emitter regions.

I. opening contact holes n said final layer of said insulating material over said polysilicon material and said emitter.

J. and applying and delineating a layer of metal over said final layer of insulating material to provide metal contacts to said polysilicon material and to said emitter.

4. A method of fabricating a bipolar structure according to claim 1 wherein said first conductivity type impurities are boron ions and said second conductivity type impurities are arsenic ions.

5. A method of fabricating a bipolar structure according to claim 1 wherein said layered masking structure of step D includes a layer of silicon dioxide and a layer of aluminum oxide.

6. A method of fabricating a bipolar transistor having base contacts formed of polysilicon material comprising the steps of:

A. forming, on a semiconductor substrate of a first conductivity type having a collector region of opposite conductivity type disposed therein, at least two oxide isolation regions therein spaced apart a given distance over said collector region, B. applying a first layer of insulating material over said epitaxial layer and, using photo-lithographic techniques, delineating and etching to provide an opening in said insulating layer in the area between said oxide isolation regions, C. forming a layer of polysilicon material having first conductivity type impurities therein over said insulating layer and the opening therein, said polysilicon material thereby being in contact with said layer of epitaxial material in the open area of said first layer of insulating material, D. forming a second layer of insulating material over said layer of polysilicon material, E. forming a layer of metal oxide over said second layer of insulating material, F. forming a third layer of insulating material over said layer of metal oxide.

G. using photo-lithographic techniques, delineating and etching to provide an opening in said third insulating material to provide an emitter window in the region above said opening in said first layer of insulating material, H. using said emitter window in said third layer of insulating material, etching to remove said layer of metal oxide, said second layer of insulating material and said layer of polysilicon material to provide an opening therethrough to said layer of epitaxial material, I. diffusing impurities of said first conductivity type into said layer of epitaxial material in between said at least two oxide isolation regions to form extrinsic base regions beneath and in contact with said polysilicon material and to form an intrinsic base region intermediate said extrinsic base regions and beneath the opening in said polysilicon material, J. forming a layer of insulating material over said intrinsic base region in said epitaxial material and, using said opening in said metal oxide layer as a mask, etching to remove said insulating material over said intrinsic base region to form an opening for an emitter, K. implanting impurities of said opposite conductivity type through said opening provided in step J into said intrinsic base region to form an emitter and removing said layer of metal oxide, thereby providing a bipolar structure having an emitter and having extrinsic base regions in contact with polysilicon material containing impurities of said first conductivity type.

7. A method of fabricating a bipolar structure according to claim 6 further including the steps of:

L. removing said layer of metal oxide formed in step E and forming a layer of polysilicon material containing impurities of said opposite conductivity type over said emitter, M. forming a final layer of insulating material over said polysilicon material containing impurities of said first conductivity type and said polysilicon material containing impurities of said second conductivity type, N. opening contact holes in said final layer of insulative material over said polysilicon material containing said first conductivity type impurities and said polysilicon material containing said second conductivity type impurities, O. and applying and delineating a layer of material over said final layer of insulating material to form metal contacts through said contact holes to said polysilicon containing said first conductivity type impurities and said polysilicon containing said second conductivity type impurities.

8. A method of fabricating a bipolar structure according to claim 6 further including the steps of:

L. removing said layer of metal oxide formed in step E and forming a final layer of insluting material over said polysilicon material containing impurities of said first conductivity type and over said intrinsic base and emitter regions, M. opening contact holes in said final layer of said insulating material over said polysilicon material and said emitter, N. and applying and delineating a layer of metal over said final layer of insulating material to provide metal contacts to said polysilicon material and to said emitter.

9. A method of fabricating a bipolar structure according to claim 6 wherein said first conductivity type impurities are boron ions and said second conductivity type impurities are arsenic ions.

10. A method of fabricating a bipolar structure according to claim 6 wherein said layer of metal oxide of step E is a layer of aluminum dioxide.

* * * * *

UNITED STATES PATENT AND TRADEMARK OFFICE
CERTIFICATE OF CORRECTION

PATENT NO. : 4,157,269
DATED : June 5, 1979
INVENTOR(S) : Ning et al

It is certified that error appears in the above-identified patent and that said Letters Patent are hereby corrected as shown below:

Cover Page - Title [54] "UTILIZING POLYSILICON DIFFUSION SOURCES AND SPECIAL MASKING TECHNIQUES" should read
--[54] METHODS FOR FABRICATING SELF-ALIGNED BIPOLAR TRANSISTORS HAVING POLYSILICON BASE CONTACTS WITH POLYSILICON OR METAL EMITTER CONTACTS UTILIZING POLYSILICON DIFFUSION SOURCES AND SPECIAL MASKING TECHNIQUES--.

Column 1, lines 1 and 2, "UTILIZING POLYSILICON DIFFUSION SOURCES AND SPECIAL MASKING TECHNIQUES" should read
--METHODS FOR FABRICATING SELF-ALIGNED BIPOLAR TRANSISTORS HAVING POLYSILICON BASE CONTACTS WITH POLYSILICON OR METAL EMITTER CONTACTS UTILIZING POLYSILICON DIFFUSION SOURCES AND SPECIAL MASKING TECHNIQUES--.

Column 2, line 33, "a" should read --as--.
Column 4, line 42, "epitaxil" should read --epitaxial--.
Column 4, line 59, "making" should read --masking--.
Column 5, line 38, "n" should read --in--.
Column 6, line 58, "material" should read --metal--.

Signed and Sealed this

Seventeenth Day of November 1981

[SEAL]

Attest:

GERALD J. MOSSINGHOFF

Attesting Officer    Commissioner of Patents and Trademarks